United States Patent [19]
Hashimoto et al.

[11] Patent Number: 5,294,812
[45] Date of Patent: Mar. 15, 1994

[54] SEMICONDUCTOR DEVICE HAVING IDENTIFICATION REGION FOR CARRYING OUT FAILURE ANALYSIS

[75] Inventors: Kazuhiko Hashimoto; Masataka Matsui, both of Tokyo; Syoichi Asoh, Ooita, all of Japan

[73] Assignee: Kabushiki Kaisha Toshiba, Kawasaki, Japan

[21] Appl. No.: 38,063

[22] Filed: Mar. 26, 1993

Related U.S. Application Data

[63] Continuation of Ser. No. 757,814, Sep. 11, 1991, abandoned.

[30] Foreign Application Priority Data

Sep. 14, 1990 [JP] Japan .................................. 2-242464

[51] Int. Cl.$^5$ ............................................ H01L 29/34
[52] U.S. Cl. ................................... 257/65; 257/297; 257/289; 257/786; 257/773; 257/48
[58] Field of Search ................ 357/52, 65; 257/65, 257/297, 289, 786, 773, 213, 206, 48

[56] References Cited

U.S. PATENT DOCUMENTS

| | | | |
|---|---|---|---|
| 4,896,204 | 1/1990 | Hirata et al. | 257/765 |
| 4,908,690 | 3/1990 | Hata et al. | 257/288 X |
| 5,065,222 | 11/1991 | Ishii | 357/52 |
| 5,089,866 | 2/1992 | Iwasa | 357/52 |
| 5,105,235 | 4/1992 | Tomita | 257/288 X |
| 5,177,567 | 1/1993 | Klersy | 257/760 X |

*Primary Examiner*—Robert J. Pascal
*Assistant Examiner*—Reginald A. Ratliff
*Attorney, Agent, or Firm*—Finnegan, Henderson, Farabow, Garrett & Dunner

[57] ABSTRACT

A semiconductor device capable of performing a failure analysis includes a semiconductor substrate having a plurality of circuit elements, and an identification region provided above the semiconductor substrate so as to record identification information such as position information within wafers, information for wafer numbers, etc. The identification information is given by binary coded patterns, fused patterns of fuse elements, etc.

21 Claims, 11 Drawing Sheets

SEMICONDUCTOR DEVICE HAVING IDENTIFICATION REGION FOR CARRYING OUT FAILURE ANALYSIS

This application is a continuation of application Ser. No. 07/757,814 now abandoned filed Sept. 11, 1991.

BACKGROUND OF THE INVENTION

1. Field of the Invention

The present invention relates to a semiconductor device capable of easily performing a failure analysis even after a silicon wafer is subjected to dicing to provide semiconductor chips.

2. Description of the Related Art

FIG. 11 shows an example of a conventional process from manufacture to shipping of silicon large scale integration (LSI) devices.

According to the process shown in FIG. 11, a wafer process is performed after masks and wafers are separately produced. The wafer process is carried out, as shown in FIG. 12, using a silicon (100) wafer having a diameter of 125 mm and a thickness of 625 $\mu$m which has been formed in the wafer manufacturing process shown in FIG. 11. More specifically, circuit elements are formed on the silicon wafer by means of well-known techniques such as oxidation, diffusion, epitaxy, formation of insulating films, formation of electrodes, ion implantation, lithography, cleaning, etc. In most cases, the processes of the oxidation, formation of insulating films, and cleaning are usually performed for each set of 20 to 30 silicon wafers, while the processes of the formation of electrodes, ion implantation, and lithography are carried out for each silicon wafer.

The silicon wafer, which has been subjected to the wafer process, includes a plurality of chips $A_1$ to $A_{46}$, as shown in FIG. 13. Each of the chips is about $1.5 \times 1.5$ cm$^2$ in size. As shown in FIG. 11, an electrical test called "probing", that is, a probe test (primary test) is carried out for the silicon wafer. The chips $A_1$ to $A_{46}$ formed on the silicon wafer are separated from one another and then an assembly process is performed to provide connection terminals on these chips. After a packaging process for sealing each of the chips in a package is performed, an electrical test, that is, a secondary test is carried out. Subsequently, a final test, testing the reliability and quality are carried out and semiconductor devices and the devices are shipped after the final test.

In the wafer process described above, when a plurality of silicon wafers are treated at the same time, an unintended variation in the silicon wafers may occur. The variation causes chips, formed from different silicon wafers, to have different characteristics. The different characteristics may result in deterioration of the chips and decrease in the yield. An undesired variation in the same silicon wafer may also occur. Therefore, chips formed from the same silicon wafer have different characteristics, resulting in decrease in yield of devices.

A case where the undesired variation in silicon wafers processed at the same time occur, will be described with reference to FIG. 14. FIG. 14 is a graph whose abscissa shows a position of silicon wafers in a treating apparatus and whose ordinate shows the thickness of gate oxide films of MOSFETs used in the silicon LSI device. As is apparent from FIG. 14, the thickness of the gate oxide films is caused to differ from one another in accordance with the position of the silicon wafers, and at the most 10 percent of variation occurs. Since the thickness of the gate oxide films of the MOSFETs is in proportion to their drive currents, if about 10 percent of variation occurs, the operation speed may be decreased by 10 percent and the power consumption may be increased by 10 percent. The variation is very unfavorable for the devices.

A case where the undesired variation in the same silicon wafer occurs, will be described with reference to FIG. 15. FIG. 15 shows a variation in gate length occurring when the gate electrodes of MOSFETs are etched by means of a well-known reactive anisotropic etching apparatus and, in other words, it shows a deviation from a desired gate length like a contour line. As is apparent from FIG. 15, the size of the gate electrode directly changes the characteristics of the MOSFET. If, for example, the size is large, a logic gate is greatly delayed to deteriorate the performance of devices. Consequently, a large gate electrode is very unfavorable for the device.

It is therefore necessary to analyze the cause of a chip failure due to the undesirable variation, thereby improving the chip failure.

However, the cause of the chip failure due to the variation can be analyzed only by the foregoing probe test, because the probe test is a measurement under the silicon wafer. The chip failure cannot be analyzed after the silicon wafer is diced to provide chips and the chips are packaged. Since the chips simultaneously provided from the silicon wafer have the same structure, it is impossible to specify the position of a chip with a failure in the silicon wafer before the chip is separated from the wafer.

The probe test is directed to sorting defective chips which are not operated at all. Since the final test is carried out after the probe test, electrical characteristics cannot be measured by the probe test in detail. This makes it more difficult to analyze a failure of semiconductor devices.

As described above, conventionally, the unintended variation is caused. That is, the thickness of a thin film, the uniformity of etching, the crystallinity of silicon wafer, the amount of impurity and the like depend the position of the same silicon wafer or different silicon wafers. The chip failure is also caused by the thickness of the thin film, the uniformity of etching, the crystallinity of silicon wafer, the amount of impurity, and the like. In other words, the failure analysis can be made from position information of chips within silicon wafers, and the cause of the failure can be eliminated. However, the failure cannot be analyzed after the wafer is separated into chips.

SUMMARY OF THE INVENTION

It is, therefore, an object of the present invention to provide a semiconductor device capable of analyzing failures of semiconductor chips and packaged semiconductor chips.

According to one aspect of the present invention, there is provided a semiconductor device capable of performing a failure analysis, which includes a semiconductor substrate having a plurality of circuit elements, and an identification region provided above the semiconductor substrate so as to record identification information such as position information within wafers, information for wafer numbers, etc. The identification information is given by binary coded patterns, fused patterns of fuse elements, etc.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Embodiments of the present invention will be described in detail with reference to the accompanying drawings.

Figure 1A:
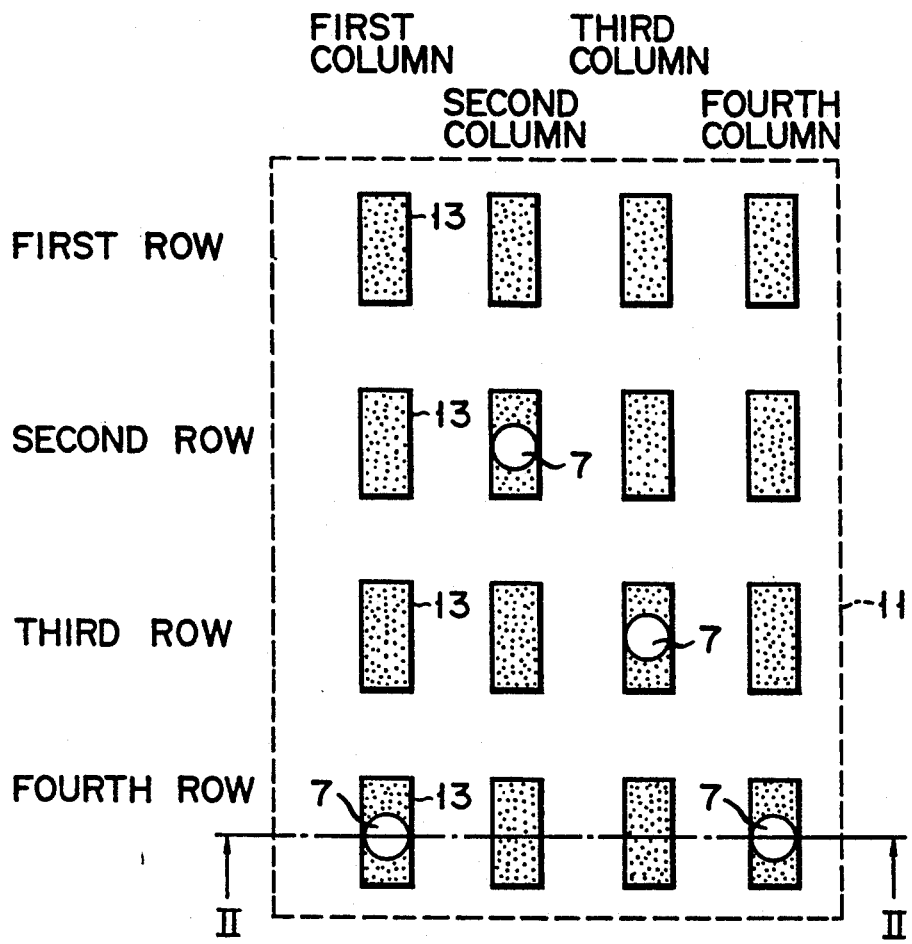
FIG. 1A is a plan view showing an identification pattern of a semiconductor chip according to a first embodiment of the present invention.
Figure 2:
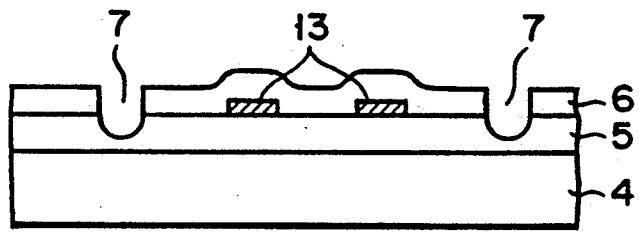
FIG. 2 is a cross-sectional view taken along line II—II of FIG. 1.

FIG. 1A is a plan view showing an identification pattern of a semiconductor chip according to a first embodiment of the present invention, and FIG. 2 is a cross-sectional view taken along line II—II of FIG. 1. In FIG. 1A, reference numeral 11 denotes an identification region, and 13 shows polysilicon pattern segments. In FIG. 2, reference numeral 4 indicates a silicon substrate, 5 represents a silicon oxide film formed on the silicon substrate, 6 denotes a passivation film covering the substrate surface including the polysilicon pattern segments 13, and 7 indicates concave portions formed by fusing the polysilicon pattern segments 13 by means of a laser beam.

Figure 3:
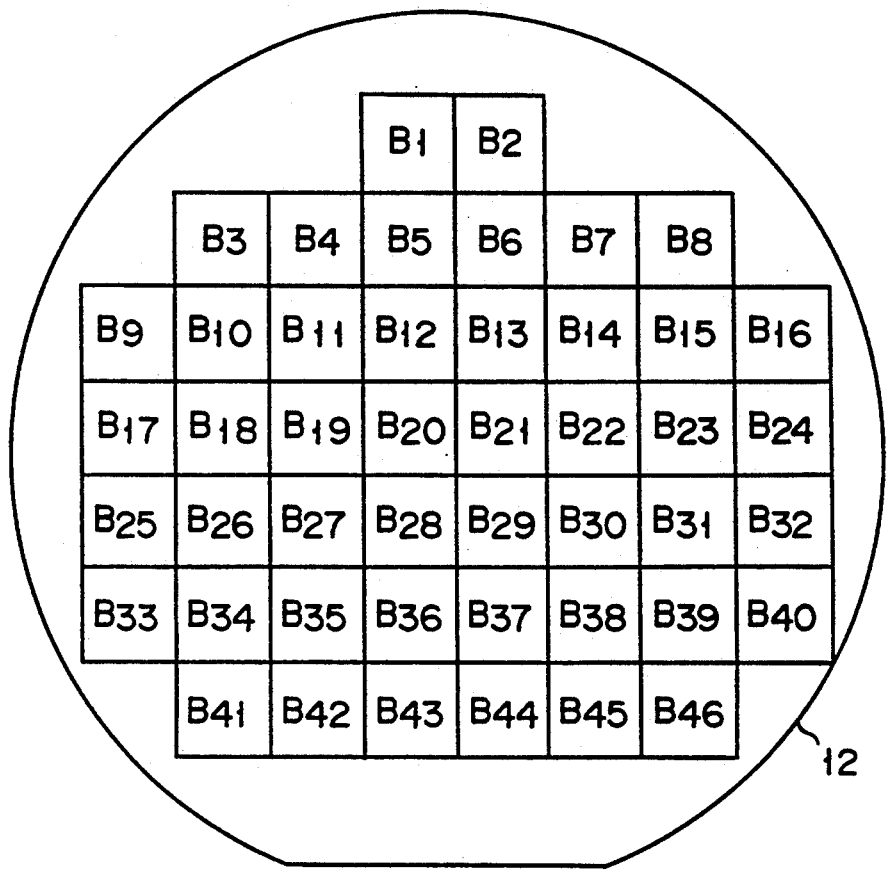
FIG. 3 is a plan view showing a silicon wafer including a plurality of semiconductor chips.
Figure 4:
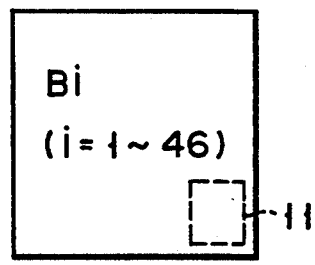
FIG. 4 is a plan view showing a semiconductor chip provided from the same silicon wafer.

According to the first embodiment, semiconductor chips simultaneously formed from the same silicon wafer each have the identification region 11 for discriminating one of the semiconductor chips from the others. The identification region 11 records information of the silicon wafer having semiconductor chips and position information within the silicon wafer. The identification region 11 is provided for each of a plurality of semiconductor chips $B_1$ to $B_{46}$ simultaneously formed from the same silicon wafer 12, as shown in FIG. 3. More specifically, as shown in FIG. 4, the identification region 11 is formed in part of each of the semiconductor chips $B_1$ to $B_{46}$. The identification region 11 has the polysilicon pattern segments 13 which are separated from one another and arranged in matrix. The polysilicon pattern segments 13 are so arranged that each of them is a rectangle of $2 \times 5$ $\mu m^2$ while viewed from the top. Further, the polysilicon pattern segments 13 are arranged at intervals of about 10 $\mu m$. In the first embodiment of the present invention, the polysilicon pattern segments 13 are arranged in $4 \times 4$ matrix.

The polysilicon pattern segments 13 are formed on the semiconductor chips simultaneously provided from the same silicon wafer. The polysilicon pattern segments 13 record information of the silicon wafer and position information within the silicon wafer. More specifically, a well-known apparatus using a YAG laser is used to fuse the polysilicon pattern segments 13 in accordance with the information of the silicon wafer and position information in the silicon wafer. For example, the polysilicon pattern segments existing in the first column and fourth row, in the second column and second row, in the third column and third row, and in the fourth column and fourth row, are fused through the passivation film 6. Since, therefore, identification information, which is given by the concave portions 7 particular to the semiconductor chip, is provided in the identification region 11, the semiconductor chip can be discriminated from the other semiconductor chips. In the first embodiment wherein the polysilicon pattern segments 13 are arranged in $4 \times 4$ matrix, when information is recorded by fusing any one of the polysilicon pattern segments in each column, combinations of $4^4 = 256$ are possible to record 256 information data.

In the first embodiment, the polysilicon pattern segments 13 are arranged in a $4 \times 4$ matrix. The segments 13 can be increased or decreased in number in accordance with an the amount of necessary information. For example, in addition to the first embodiment, if information is recorded in accordance with whether all the polysilicon pattern segments 13 are fused or not, combinations of $2^{16} = 65536$ are possible and thus 65536 information data can be recorded. In the first embodiment, the polysilicon pattern segments 13 are arranged in a matrix in the identification region 11. However, they can be arranged at random in an arbitrary position of each semiconductor chip. The shape of each of the polysilicon pattern segments is not limited to a rectangle, but may be a square, a circle, a rhombus, an ellipse, a trapezoid, and the like. Further, the material of the pattern segments 13 is not limited to polysilicon but can be replaced with metals, metal silicides, insulators, and layered structures of them including polysilicon, if the pattern segments using such material can be easily fused. In the first embodiment, information is recorded in accordance with whether a part of at least one pattern segment in the polysilicon pattern segments is removed by the laser beam or not.

Figure 1B:
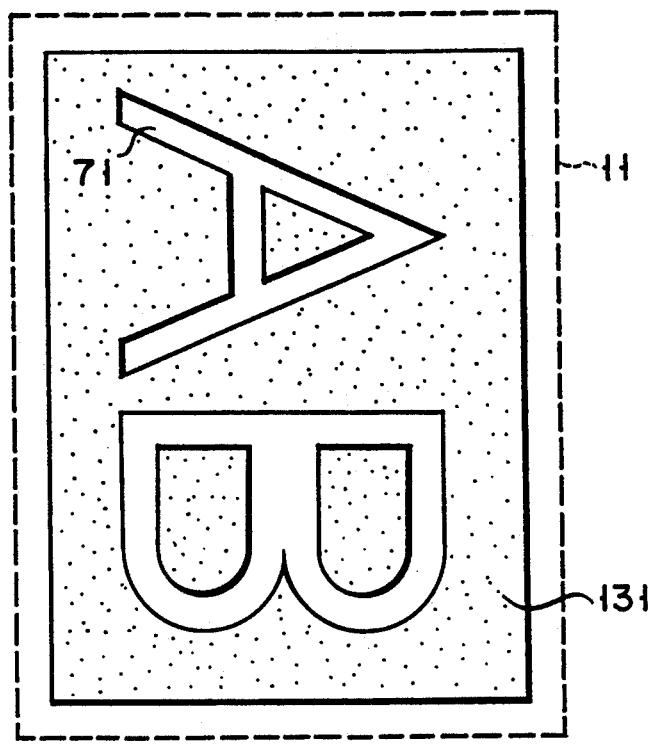
FIG. 1B is a plan view showing an identification pattern of a semiconductor chip according to one modification of the first embodiment of the present invention.
Figure 1C:
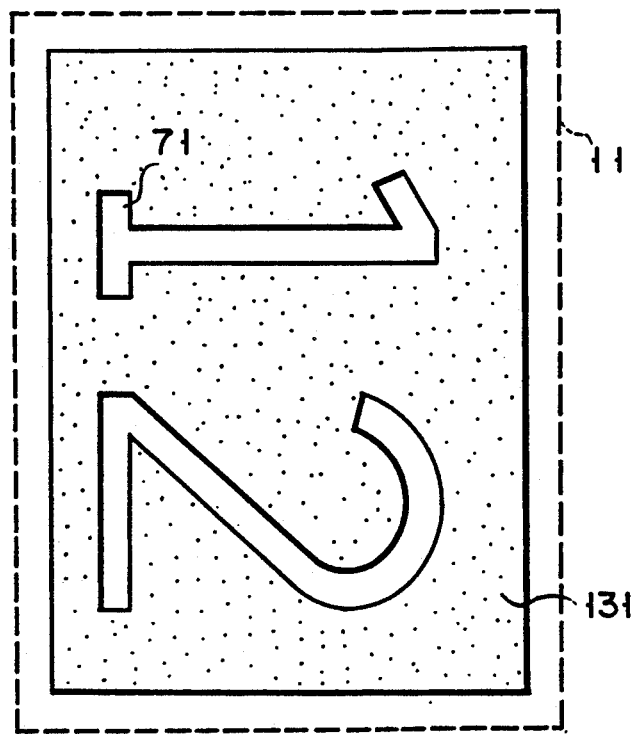
FIG. 1C is a plan view showing an identification pattern of a semiconductor chip according to another modification of the first embodiment of the present invention.

FIG. 1B and FIG. 1C indicate modifications of the first embodiment, and show an identification pattern of different characters, for example "AB" and different numerals, for example "12", respectively, as the identification information. The basic structure is the same as that of the first embodiment except that the pattern segments 13 are replaced with a layer 131 in FIG. 2. These patterns are provide as follows.

The layer 131 whose material is the same as that of the pattern segments 13 is formed on the entire surface of the silicon oxide film 5. After covering the substrate surface with the passivation film 6, the layer 131 is patterned through the passivation film 6 by a laser beam as presented by a groove 71, thereby providing the identification pattern of "AB" or "12".

Figure 5:
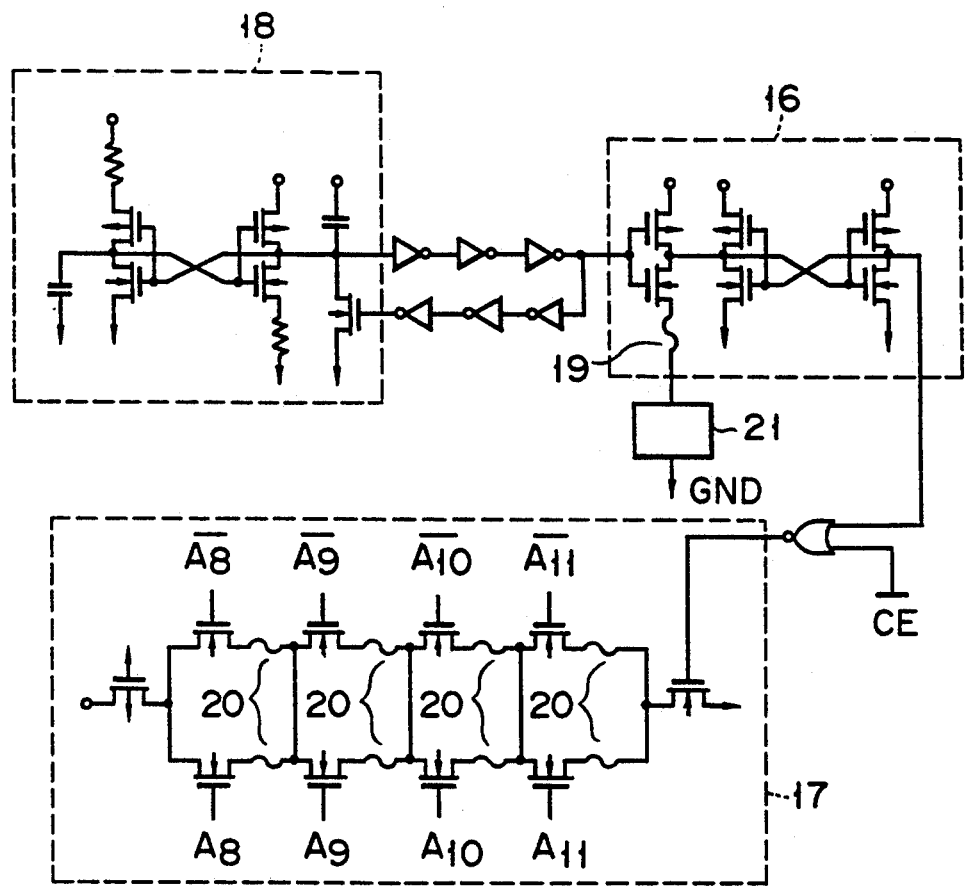
FIG. 5 is a circuit diagram of a semiconductor chip according to a second embodiment of the present invention.
Figure 6:
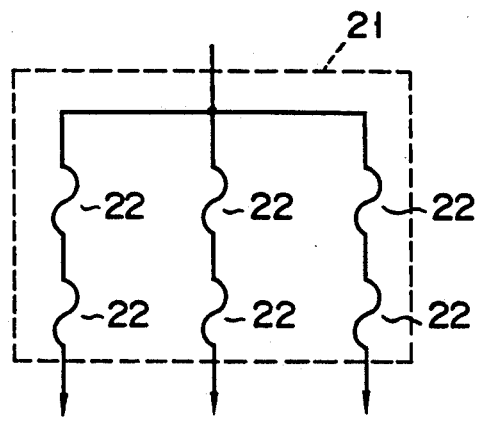
FIG. 6 is a view minutely showing an identification region formed in the semiconductor chip shown in FIG. 5.

FIG. 5 is a circuit diagram of a semiconductor chip according to a second embodiment of the present invention. FIG. 6 is a view minutely showing an identification region 21 formed in the semiconductor chip shown in FIG. 5. In FIG. 5, reference numeral 16 indicates a spare enable latch, 17 denotes a spare column decoder, and 18 shows a power-on pulse generator.

A large-capacity static random access memory (SRAM) usually includes a redundancy circuit. The redundancy circuit is activated by melting a fuse 19 of the spare enable latch 16. A plurality of fuses 20 of the spare column decoder 17 are melted in response to address signals A8 to A11 and replaced with a desired group of memory cells.

In the second embodiment, the identification region 21, on which position information or the like within the chip is recorded, is provided between a ground (GND) and the fuse 19 of the spare enable latch 16. More specifically, the identification region 21 includes fuses 22 arranged in 2×3 matrix. In the second embodiment, a predetermined one of the fuses 22 is melted at the same time when the fuse 19 is melted to activate the redundancy circuit and, in other words, the fuses 22 are melted in accordance with information of the silicon wafer or position information within the silicon wafer. In the second embodiment wherein the fuses 22 are arranged in 2×3 matrix, if information is recorded by melting any one of the fuses in each column, combinations of $2^3=8$ are possible and thus eight information data can be recorded.

Figure 7A:
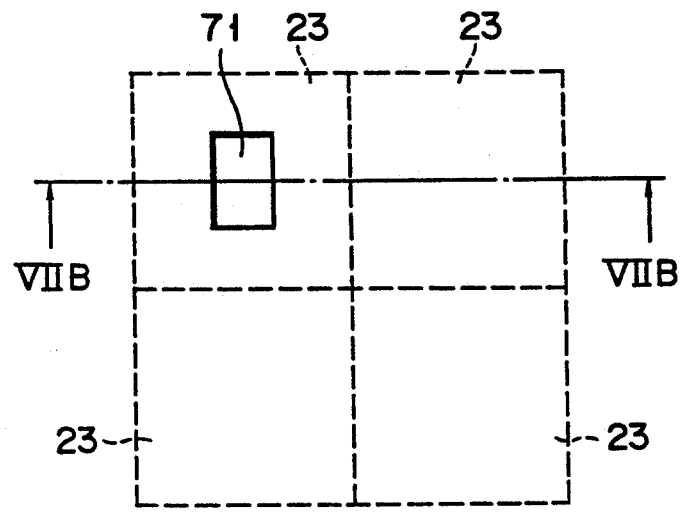
FIG. 7A is a plan view showing an identification region formed in a semiconductor chip according to a third embodiment of the present invention.
Figure 7B:
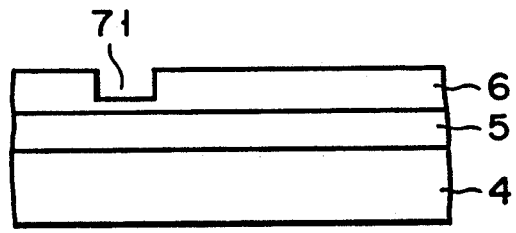
FIG. 7B is a cross-sectional view taken along line VIIB—VIIB of FIG. 7A.

FIGS. 7A and 7B show a semiconductor chip according to a third embodiment of the present invention.

In the first and second embodiments, the pattern segments or fuses are melted by means of the laser beam in order to store position information within semiconductor wafer or the like in individual semiconductor chips. As described below, however, the pattern segments or fuses can be melted by means of a known focusing ion beam. More specifically, a gallium (Ga) ion beam is focused by an ion optical system using, for example, Ga ions in a vacuum, and the Ga ion beam is deflected by properly applying an electric potential in X-Y directions. The Ga ion beam is then applied to a region (identification region) 23 which is predetermined in accordance with position information of the wafer or the like. As a result, the passivation film 6, which covers the insulating film 5 formed on the silicon substrate 4, is etched, and a concave portion 71 particular to the semiconductor chip is thus formed in the region 23, thereby making it possible to record predetermined information. In the third embodiment, the region 23 is defined by two rows and two columns. If, therefore, information is recorded by melting any one of the rows in each of the columns, combinations of $2^2=4$ are possible, and thus four information data can be recorded.

Figure 8A:
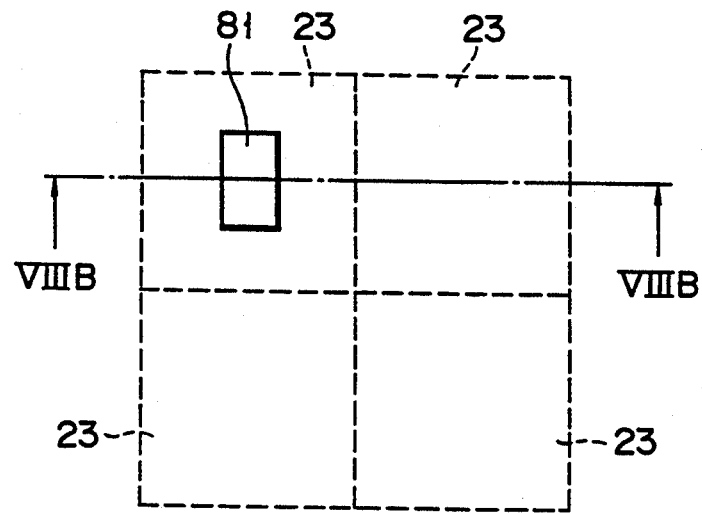
FIG. 8A is a plan view showing an identification region formed in a semiconductor chip according to a fourth embodiment of the present invention.
Figure 8B:
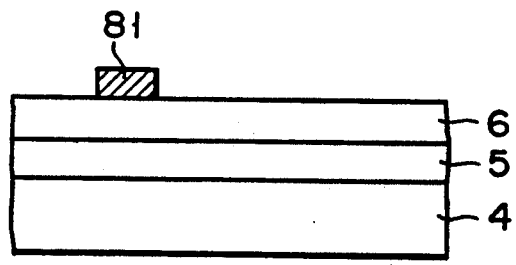
FIG. 8B is a cross-sectional view taken along line VIIIB—VIIIB of FIG. 8A.

FIGS. 8A and 8B show a semiconductor chip according to a fourth embodiment of the present invention. It is known that a tungsten (W) film is deposited on the semiconductor chip if a gas of W(CO)6 introduced during application of the ion beam. More specifically, unlike the third embodiment, a tungsten film pattern is formed on the region 23 if a gas of W(CO)6 is introduced at the same time when an ion beam is applied to the region 23 which is predetermined in accordance with position information within the wafer or the like. In other words, a convex portion 81 of the tungsten film is provided on the passivation film 6 covering the insulating film 5 formed on the silicon substrate 4, and predetermined information can be recorded.

In the fourth embodiment, the tungsten film can be deposited on the region 23 to record predetermined information so that different numerals or different characters such as alphabets are added to individual semiconductor chips. Since the tungsten film pattern can be formed using a focusing laser assist CVD, an electronic beam, or the like in place of the focusing ion beam, the same advantage can be obtained. Further, information of the silicon wafer and position information in the silicon wafer can be immediately recorded after a plurality of semiconductor chips are formed on the silicon wafer or in the process of manufacturing a semiconductor device.

Figure 9:
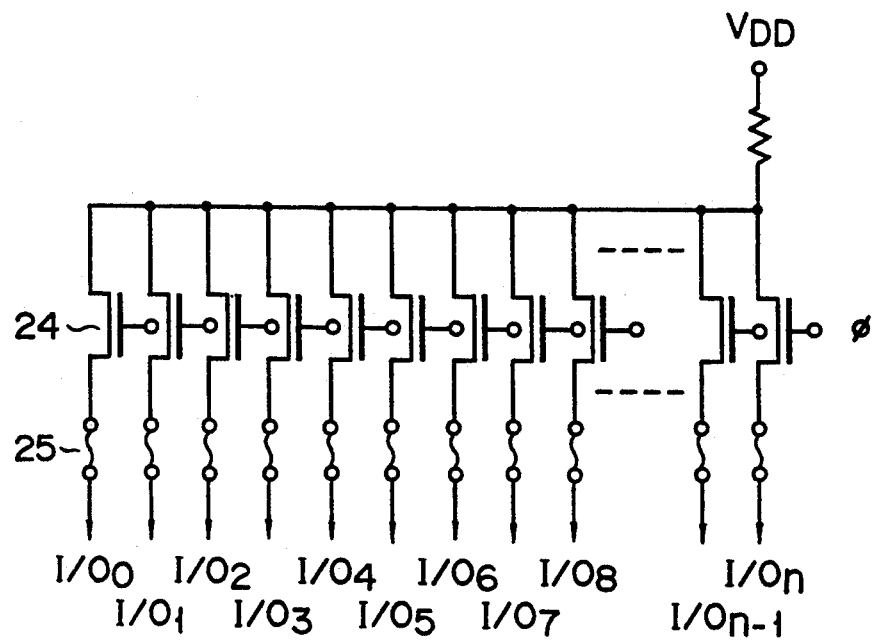
FIG. 9 is a circuit diagram of an identification region formed in a semiconductor chip according to a fifth embodiment of the present invention.
Figure 10:
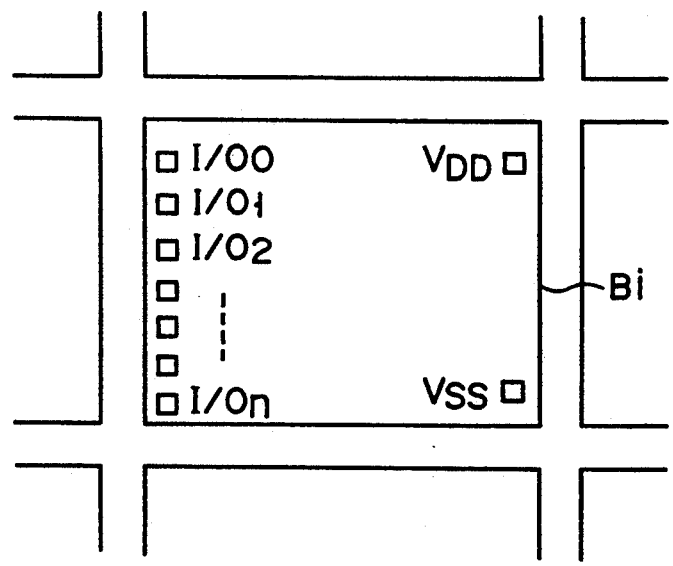
FIG. 10 is a view schematically showing the semiconductor chip shown in FIG. 9.
Figure 11:
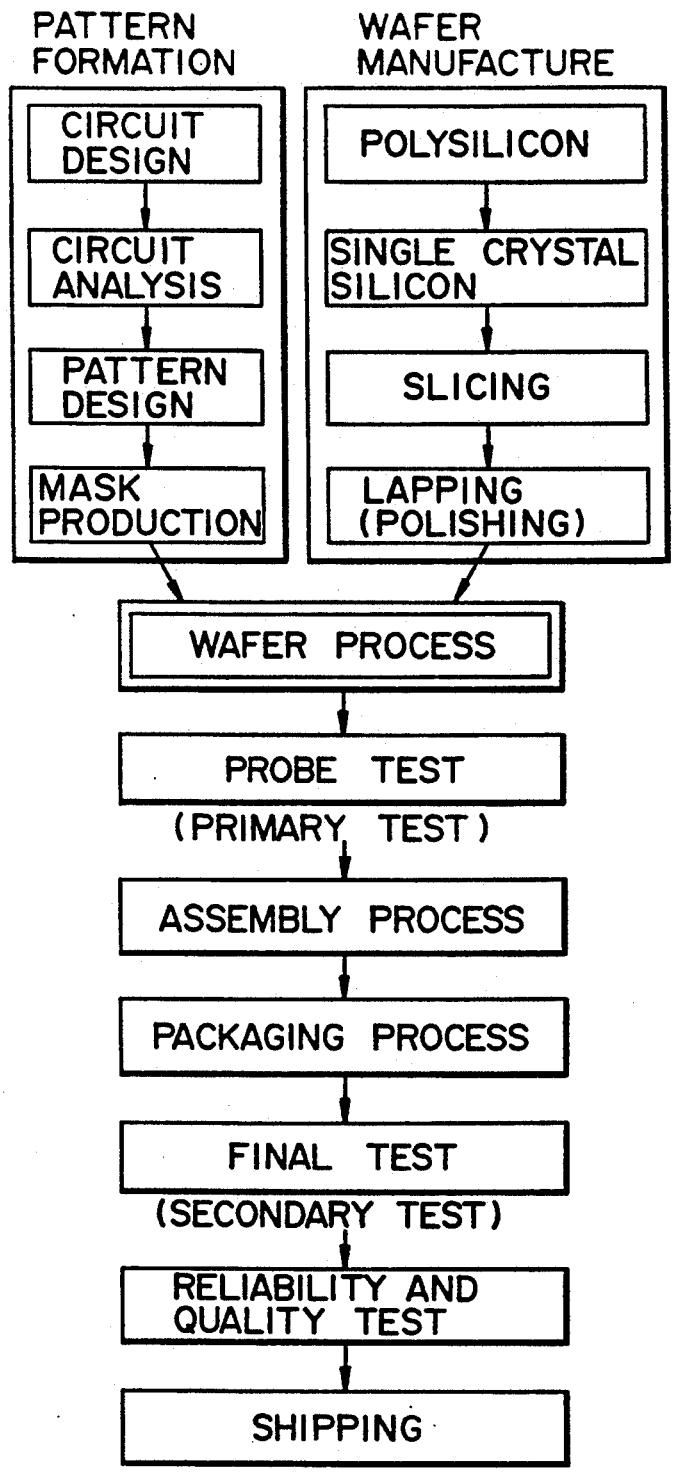
FIG. 11 is a block diagram showing a flow from manufacture to shipping of a conventional semiconductor device.
Figure 12:
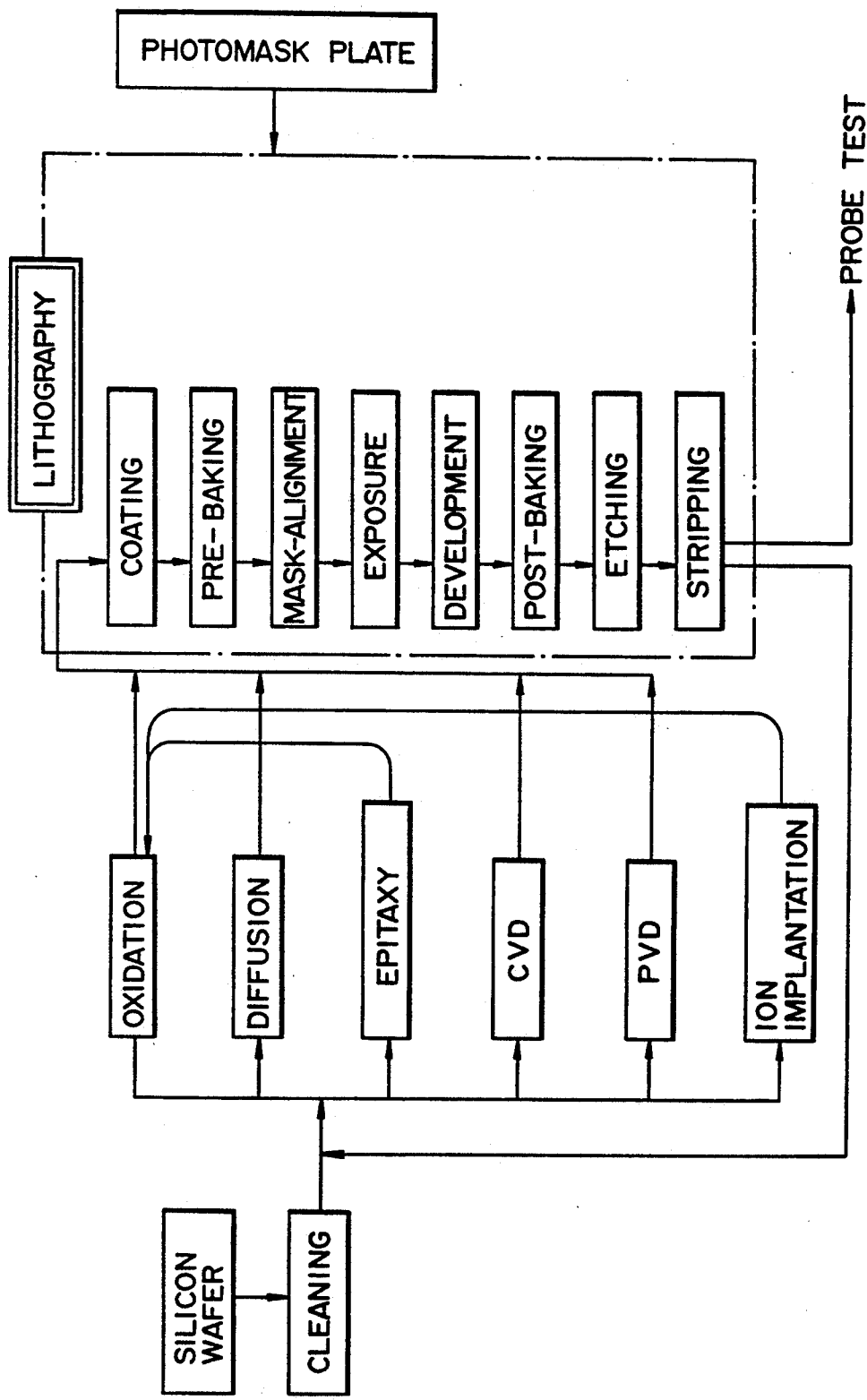
FIG. 12 is a block diagram showing a flow of a conventional wafer process.
Figure 13:
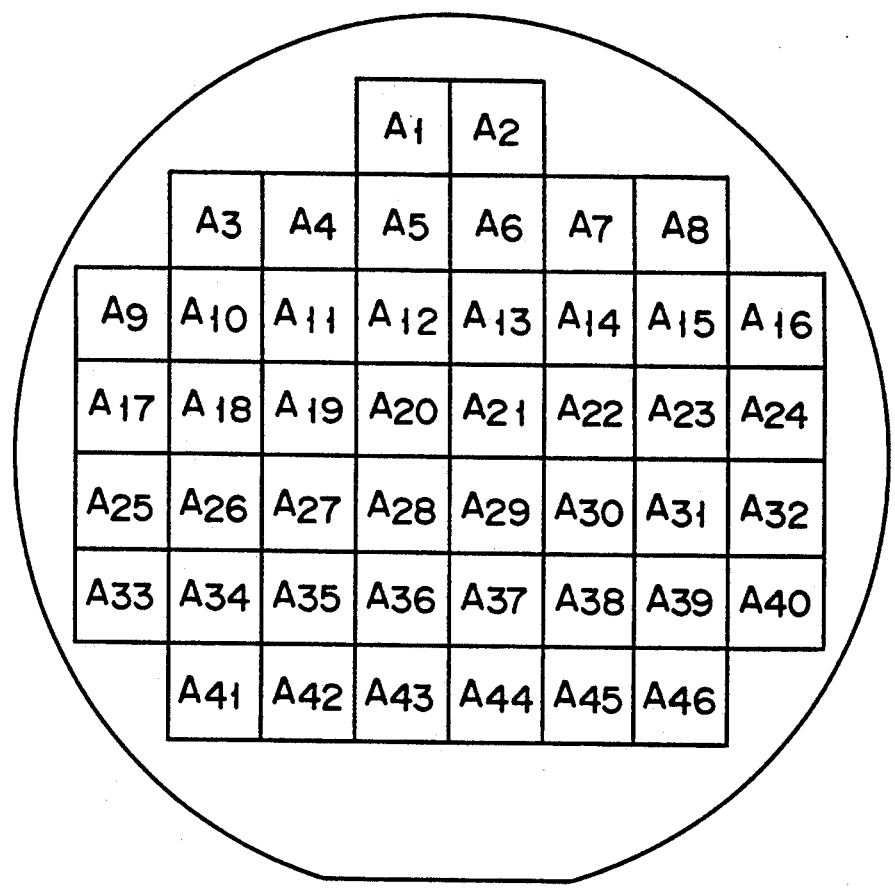
FIG. 13 is a plan view showing a conventional silicon wafer.
Figure 14:
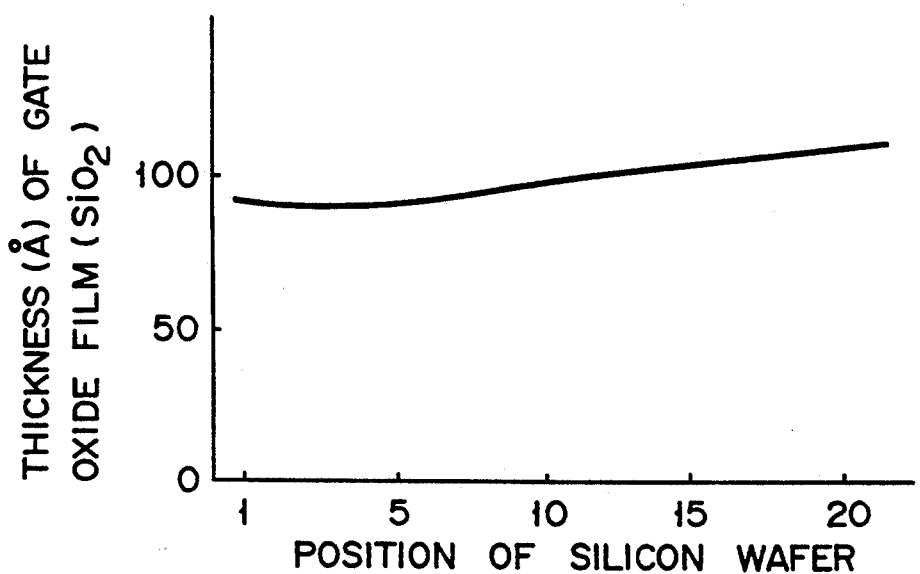
FIG. 14 is a graph showing an example in the case where an unintended variation in silicon wafers treated at the same time occurs.
Figure 15:
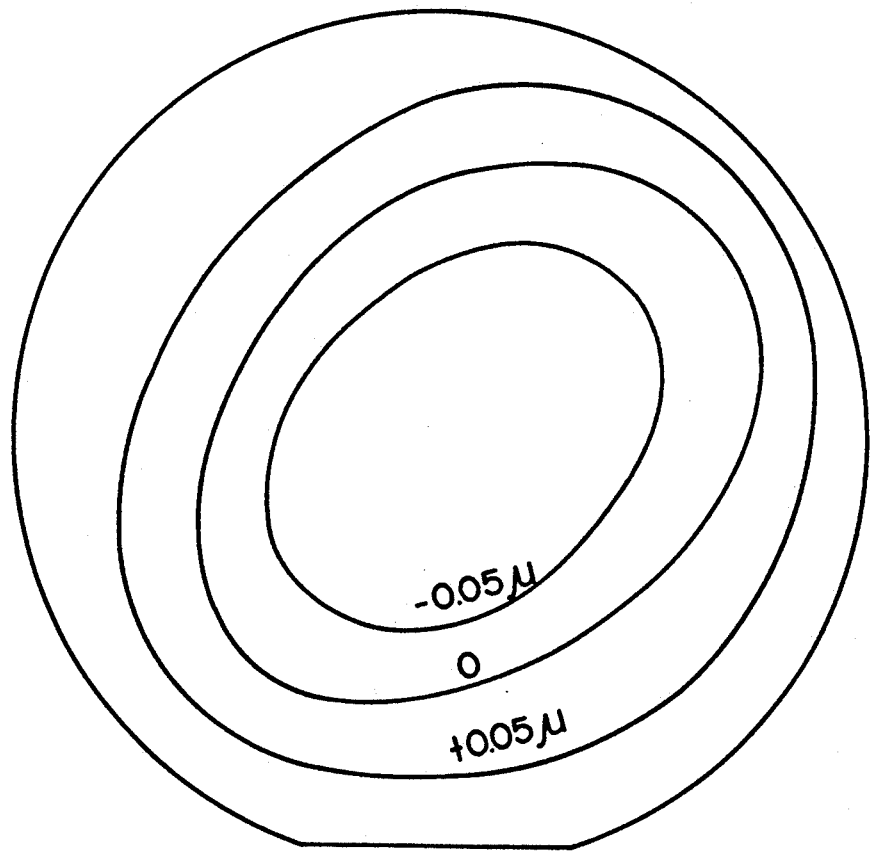
FIG. 15 is a view showing an example in the case where an unintended variation in the same silicon wafer occurs.

FIG. 9 shows a structure of an identification region formed in a semiconductor chip according to a fifth embodiment of the present invention. FIG. 10 is a view schematically showing the semiconductor chip shown in FIG. 9.

A plurality of semiconductor chips $B_i$ simultaneously formed from the same silicon wafer include a circuit (shown in FIG. 9) for recording information of the silicon wafer and position information in the silicon wafer, such as lot numbers, wafer numbers, and position numbers in the wafer. A group of MOSFETs (read means) 24 are provided in each of the semiconductor chips $B_i$. The drains of the MOSFETs 24 are connected to a pad of $V_{DD}$, the and the sources thereof are connected to predetermined fuses (register) 25. The fuses 25 are connected to pads of $I/O_0$ to $I/O_n$ used in the normal operation.

The information of the silicon wafer and the position information within the silicon wafer are recorded by melting the fuses 25 in a predetermined combination of them in the wafer state. The melting of the fuses 25 is predetermined by codes or the like.

According to the structure, even after the semiconductor chips are separated from the silicon wafer, the position of the silicon wafer, the wafer number, the lot number, and the like can be confirmed by applying ON signals (control signals) $\phi$ to the MOSFETs 24 and measuring signals fed from the pads of $I/O_0$ to $I/O_n$. Unless the ON signals $\phi$ are applied, a normal input signal may be supplied to the pads of $I/O_0$ to $I/O_n$ to normally operate the semiconductor chip.

Since the pads of the $I/O_0$ to $I/O_n$ are used in the fifth embodiment, the failure analysis of the semiconductor chip can be performed even when they are in a packaged or shipped state. On the other hand, after the circuit shown in FIG. 9 is incorporated into a predetermined region of the semiconductor chip, pads, which are not used in the normal operation, can be connected to the fuses 25. Since, in this case, the semiconductor chip has no measurement terminals in its packaged state, the package is opened to directly take out a signal from the pads and thus to read out information.

As has been described above, the semiconductor chips or the semiconductor devices according to the present invention have the following advantages.

An identification region is formed in each of plural semiconductor chips which are obtained from the same silicon wafer. The identification region includes a concave or convex portion particular to the semiconductor chip. Each of the semiconductor chips includes a circuit for storing predetermined information and reading out them.

For this reason, even after the semiconductor chips are separated from the silicon wafer, the separated chips are packaged, or the packages are shipped, a failure analysis of each semiconductor chip can be performed. In other words, when desired characteristics are not obtained or a failure is found in the final test, or when a failure is caused after semiconductor chips are shipped, position information in the semiconductor chip can easily be detected.

Consequently, according to the present invention, a failure of a semiconductor chip can easily be analyzed and a cause of the failure can be eliminated, so that a semiconductor device having good performance and stable characteristics can be obtained. Furthermore, since the elimination of the cause of the failure increases the yield in the manufacture of semiconductor devices, the device can be manufactured in low cost.

It is further understood by those skilled in the art that the foregoing description is preferred embodiments and that various changes and modifications may be made in the invention without departing from the spirit and scope thereof.

What is claimed is:

1. A semiconductor device including a semiconductor substrate having a plurality of circuit elements, an insulating film covering a surface of the semiconductor substrate, and a passivation film covering the insulating film, the semiconductor device further comprising:
   an identification region, located at a corner of the semiconductor substrate, including a plurality of pattern segments provided on the insulating film, the plurality of pattern segments being covered with the passivation film, wherein
   a portion of at least one of the plurality of pattern segments is removed along with the insulating film and the passivation film to provide an identification pattern for providing identification information regarding the semiconductor device.

2. The semiconductor device according to claim 1, wherein the identification pattern provides coded information.

3. The semiconductor device according to claim 1, wherein the plurality of pattern segments are formed in a matrix-shaped pattern.

4. The semiconductor device according to claim 1, wherein the plurality of pattern segments comprise a material selected from polysilicon, a metal, metal silicide and an insulator.

5. The semiconductor device according to claim 1, wherein each of the plurality of pattern segments is rectangular.

6. The semiconductor device according to claim 1, wherein the portion of the at least one of the plurality of pattern segments is removed by a laser beam.

7. A semiconductor device including a semiconductor substrate having a plurality of circuit elements, an insulating film covering a surface of the semiconductor substrate, and a passivation film covering the insulating film, the semiconductor device further comprising:
   an identification region, located at a corner of the semiconductor substrate, including a layer for providing an identification pattern, the layer being formed on a portion of the insulating film and covered with the passivation film, wherein
   the layer is patterned from the passivation film to form the identification pattern for providing identification information regarding the semiconductor device.

8. The semiconductor device according to claim 7, wherein the identification pattern is a combination of different characters.

9. The semiconductor device according to claim 7, wherein the identification pattern is a combination of different numerals.

10. The semiconductor device according to claim 7, wherein the layer comprises a material selected from polysilicon, a metal, metal silicide and an insulator.

11. The semiconductor device according to claim 7, wherein the layer is patterned by a laser beam.

12. A semiconductor device including a semiconductor substrate having a plurality of circuit elements, an insulating film covering a surface of the semiconductor substrate, and a passivation film covering the insulating film, the semiconductor device further comprising:
   an identification region, located at a corner of the passivation film, including an identification pattern of identification information regarding the semiconductor device.

13. The semiconductor device according to claim 12, wherein the identification pattern comprises a concave pattern formed in the passivation film.

14. The semiconductor device according to claim 12, wherein the identification pattern comprises a convex pattern formed on the passivation film.

15. A semiconductor device including a redundancy circuit and an enable latch having fuse means for activating the redundancy circuit, the semiconductor device further comprising:
   an identification circuit including a plurality of fuse elements situated in a matrix formation, the identification circuit being connected to the fuse means of the enable latch, wherein
   at least one of the plurality of fuse elements is fused when the fuse means of the enable latch is fused thereby providing identification information in the identification circuit regarding the semiconductor device.

16. The semiconductor device according to claim 15, wherein at least one of the plurality of fuse elements is fused in accordance with information for a wafer.

17. The semiconductor device according to claim 15, wherein at least one of the plurality of fuse elements is fused in accordance with position information within a wafer.

18. A semiconductor device including a semiconductor substrate having a plurality of circuit elements, the semiconductor device further comprising:
an identification circuit including registration means for recording identification information and read means for reading the identification information from the registration means, wherein
the registration means comprises a plurality of fuse elements connected to I/O pads.

19. The semiconductor device according to claim 18, wherein the read means comprises a plurality of FETs having respective drains connected to a power supply $V_{DD}$.

20. The semiconductor device according to claim 19, wherein each of the plurality of fuse elements is connected in series with a respective source of the plurality of FETs.

21. The semiconductor device according to claim 18, wherein at least one of the plurality of fuse elements is fused to provide the identification information.

* * * * *